United States Patent [19]

Neppl et al.

[11] Patent Number: 4,803,179

[45] Date of Patent: Feb. 7, 1989

[54] METHODS FOR MAKING NEIGHBORING WELLS FOR VLS1 CMOS COMPONENTS

[75] Inventors: Franz Neppl, Munich; Carlos-Alberto Mazure-Espejo, Kirchseeon, both of Fed. Rep. of Germany

[73] Assignee: Siemens Aktiengesellschaft, Berlin and Munich, Fed. Rep. of Germany

[21] Appl. No.: 33,261

[22] Filed: Apr. 2, 1987

[30] Foreign Application Priority Data

Jul. 4, 1986 [DE] Fed. Rep. of Germany ....... 3622504

[51] Int. Cl.[4] ......................................... H01L 21/308
[52] U.S. Cl. ...................................... 437/70; 437/69; 437/239; 437/241; 437/228; 437/233; 148/DIG. 117; 156/653; 156/657
[58] Field of Search ...................... 437/34, 56, 57, 69, 437/70, 71, 72, 73, 238, 239, 241, 233; 156/643, 653, 657; 357/42, 49, 50; 148/DIG. 117

[56] References Cited

U.S. PATENT DOCUMENTS

| | | | |
|---|---|---|---|
| 4,376,672 | 3/1983 | Wang et al. | 204/192.32 |
| 4,407,696 | 10/1983 | Han et al. | 437/69 |
| 4,434,543 | 3/1984 | Schwabe | 397/42 |
| 4,525,378 | 6/1985 | Schwabe et al. | 427/38 |
| 4,525,920 | 7/1985 | Jacobs et al. | 437/34 |
| 4,613,885 | 9/1986 | Haken | 437/34 |
| 4,630,356 | 12/1986 | Christie et al. | 437/69 |

FOREIGN PATENT DOCUMENTS 0081804 12/1982 European Pat. Off. .
0135163 8/1984 European Pat. Off. .

OTHER PUBLICATIONS

Schwabe et al. "Reduced . . . " IEDM Tech. DIG. 1984 pp. 410–413.
Schwabe et al. "N– and P–. . . " IEEE Trans Elec. Dev. vol. ED–30 No. 10, 10/83 pp. 1339–1344.
Kooi et al. "Selective Oxidation . . . " Electrochemical Society Conf. Proc. 1973 pp. 860–879.

Primary Examiner—Brian E. Hearn
Assistant Examiner—Kevin McAndrews
Attorney, Agent, or Firm—Hill, Van Santen, Steadman & Simpson

[57] ABSTRACT

A method for the manufacture of neighboring wells 9, implanted with dopant ions of differing conductivity type in silicon substrates provided with an epitaxial layer. A lateral under-etching having high selectivity to specified layers is designationally introduced into a silicon nitride layer provided for masking the n-well regions in the implantation of the p-wells. Thus, the edge of a silicon oxide layer serving as a masking in the following oxidation shifts in the direction of the n-wells. As a result of this type of self-adjusted well production, the influence of the counter-doping in the region of the well boundaries is noticeably reduced. In addition, a polysilicon layer can also be employed under the silicon nitride layer as a masking layer, this layer eing co-oxidized after the under-etching of the silicon nitride layer. Thus a box-shaped course is produced in the masking oxide instead of the prior art bird's bill course, whereby a steeper diffusion front is achieved in the n-well. The method serves for the manufacture of VLS1 complementary MOS field effect transistor circuits.

4 Claims, 3 Drawing Sheets

METHODS FOR MAKING NEIGHBORING WELLS FOR VLS1 CMOS COMPONENTS

BACKGROUND OF THE INVENTION

1. Field of the Invention

The invention lies in the field of techniques for making neighboring wells implanted with dopant ions of differing conductivity type in VLSI complementary MOS field effect transistor (CMOS) circuits.

2. Prior Art

A method of the prior art is disclosed by European Patent Application No. 0 081 804.

Modern CMOS processes are double-well processes (n-wells and p-wells) and are described in detail in, for example, IEEE Trans. on Electron Devices, ED-30 (1983), Pages 1339–1344 and in IEDM Technical Digest 1984, 15.4, pages 410–413. The production of the two wells is achieved by using separate masks or by using only one mask in a self-adjusting "double well" process execution.

The disadvantage of the self-adjusted double-well process is that a compensated region is inherently produced at the well edges or boundaries due to the three-dimensional overlap of the well dopings. The size and compensation degree thereof have a direct influence on the latch-up susceptibility of the CMOS structure, or, alternatively on the minimum possible n+/p+ spacing. The consequential effect of the compensated region is to limit the penetration depth $x_j$ of the well to relatively small values. As a consequence of the high current densities, or, alternatively, of the higher surface-proximate current component, sensitivity of the well MOSFETs to substrate currents (forward-biasing of the source diode) increases. Moreover, the junction capacitances are comparatively high since the overall charge in the well is determined by the requirements on the breakdown voltage $U_{CEO}$ and by the basic numer of the parasitic bipolar transistor. Therefore, the necessary high doping concentrations for shallow wells.

SUMMARY OF THE INVENTION

More particularly, this invention is directed to an improved method for neighboring wells generation for very large scale integration (VLSI) complementary metal oxide semiconductor (CMOS) field effect transistor (FET) circuits with n+-doped or p+-doped silicon having an n--doped or p--doped epitaxial layer respectively, is employed as a semiconductor substrate. The p-wells are implanted first into such a n-type substrate using a silicon oxide/silicon nitride layer covered with photoresist as a masking layer for the n-well regions. The n-well implants follow using a silicon oxide layer to mask the p-well regions. The edge of the silicon oxide layer is shifted in the direction of the n-well regions by directed lateral underetching of the mask used serving for the p-well implants before oxidation and implantation of the n-wells.

The main object underlying the present invention is the provision of a technique for use in the execution of a CMOS double well process wherein it is guaranteed that a great three-dimensional overlap and a charge-wise compensation at the implantation edge of the two n-implanted and p-implanted well regions is avoided without having the transistor performance deteriorated.

In the initially cited method from European Patent Application No. 0 081 804, the p-well is implanted before the n-well. The n-well exhibits a significantly smaller penetration depth than the p-well, and, when stripping the oxide layer, a great under-etching of the oxide under the nitride mask is desired, so that an optimally long bird's beak of the masking oxide which masks the following phosphorous ion implantation is formed in the subsequent production of the masking oxide for the p-well. The implantation of the n-well is then separated from the implantation edge of the p-well by the spacing etched into the oxide under nitride layer (1–2 μm, as shown, for example, in FIG. 8 of the European Patent Application).

The present invention achieves the above stated object in a different way and thereby achieves a further improvement with reference to the suppression of the counter-doping in the regions of the well boundaries. The present invention is characterized in that the under-etching is managed by means of an isotropic etching process so that it ensues into the silicon nitride mask layer lying under the photoresist mask, but the layers lying therebelow are not noticeably etched.

The pronounced lateral under-etching into the nitride mask by means of an isotropic etching mixture with high selectiveity relative to the layers lying therebelow before the removal of the photoresist displaces the edge of the following local masking oxidation by the under-etching, so that the separation of the two well implantation edges is now established by the length of the bird's beak and by the under-etching. Although a bird's beak longer than the arrangement set forth in European Patent Application No. 0 081 804 does not occur, an oxide mask of the same thickness is additionally formed which is enlarged by the length of the under-etching. This enables the adaptation of the three-dimensional separation of the n-well and p-well implantations to the drive-in of the p-well, and enables the lateral compensation effect to be greatly suppressed or avoided. The significant advantage of this procedure over the known method is the decoupling of the well penetration depth from the lateral counter-doping. It enables the production of deeper wells given unaltered implantation dose without increase of the latch-up sensitivity, whereby the transistor performance is positively influenced. Given an inadequate resistivity of the photoresist to the long over-draw of the $Si_3N_4$ in order to achieve the $Si_3N_4$ under-etching of the invention, an auxiliary polysilicon layer directly on the nitride can be employed, this being first structured with the photoresist mask, and also protecting the nitride surface in the great over-draw of the isotropic $Si_3N_4$ etching when too much photoresist is eroded.

In a further development of the inventive concept, it is provided that a triple layer composed of silicon oxide, polysilicon and silicon nitride be employed instead of the double mask layer of silicon oxide and silicon nitride, and that the polysilicon layer be co-oxidized for masking the p-well regions. Since the oxidation proceeds from the polysilicon layer, which is directly covered by the silicon nitride, the formation of a bird's beak is largely suppressed and a box-shaped masking oxide is produced. A smearing of the implantation edge due to the decreasing masking oxide thickness in the region of the bird's beak is thereby avoided, and a steeper diffusion front is achieved in the n-well drive-in, this having a beneficial influence on the latch-up behavior.

Other and further aims, objects, uses, and the like for the present invention will be apparent to those skilled in the art from the present specification.

BRIEF DESCRIPTION OF DRAWINGS

The invention is set forth in yet greater detail below in FIGS. 1-10 and two exemplary embodiments:

FIGS. 5-10 are diagrammatic vertical sectional view showing progressively the process execution with a triple masking layer composed of silicon oxide, polysilicon and silicon nitride.

The same reference characters apply to identical parts in all Figures.

DETAILED DESCRIPTION

Figure 1:
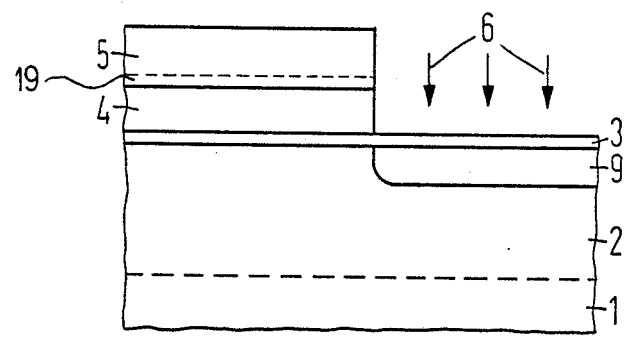
FIGS. 1-5 are diagrammatic vertical sectional views showing progressively the process execution with a double masking layer composed of silicon oxide and silicon nitride.

In FIG. 1, the p-well 9 is produced at the beginning of the process execution. An n+-doped silicon substrate 1 ((100)-Si, 0.020 ohms/cm) with an n−-doped epitaxial layer 2 ((100)-Si, 20 ohms/cm, about 6 to 8 μm) is provided with an oxide layer 3 (50 nm) and with a 100 nm thick silicon nitride layer 4 structured with a photoresist mask 5. The boron ion implantation 6 follows with a dose and energy of $2 \times 10^{12}$ cm$^{-2}$ and 160 keV, respectively.

Figure 2:
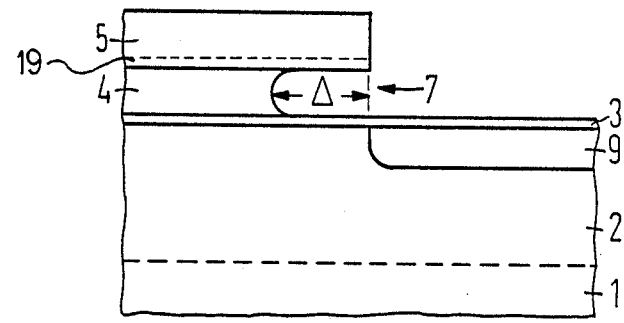

In FIG. 2, the first step essential to the invention now ensues, namely, the directed under-etching Δ (see arrow 7) into the silicon nitride layer 4, whereby a concentrated phosphoric acid solution (H$_3$PO$_4$) of 85 is employed at about 160° C., and a lateral etching depth of 1 μm derives with an etching ratio of nitride to oxide of 40:1. The etching duration is about 250 to 300 minutes.

Figure 3:
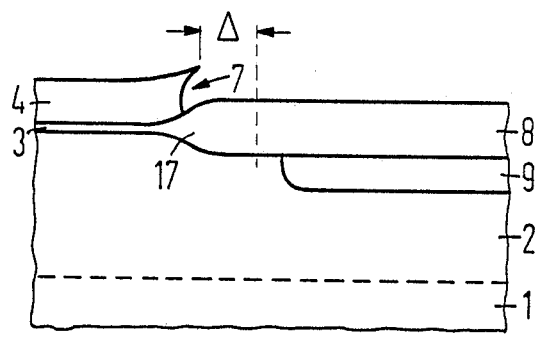

In FIG. 3 following the lateral under-etching 7, the photoresist mask 5 is removed, and the masking oxide layer 8 for the p-2311 region 9 utilized for the following phosphorous ion implantation 10 for producing the n-well 11 is generated in a layer thickness of about 0.5 to 1.0 μm. The masking oxide 8 arises in the region of the under-etching Δ 7, only partly with a bird's beak edge course 17.

Figure 4:
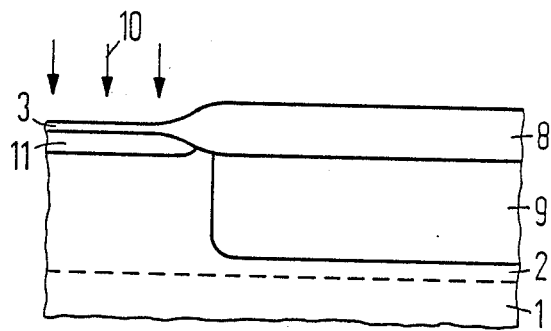

In FIG. 4, the silicon nitride layer structure 4 is removed, and, after tempering and the drive-in of the p-well 9, at, for example, 1150° C. for about 100 to 600 minutes, dependent on the thickness of the epitaxial layer 2, the phosphorous ion implantation 10 for generating the n-well 11 is carried out with a dose and an energy of $1 \times 10^{12}$ cm$^{-2}$ and 180 keV, respectively.

If the photoresist 5 has an inadequate resistivity to the etching agent during the etching necessary to achieve the under-etching of the silicon nitride layer, an auxiliary polysilicon layer 19 disposed directly above the silicon nitride layer 4 can be used, the auxiliary polysilicon layer 19 being structured together with the photoresist mask 5.

Figure 5:
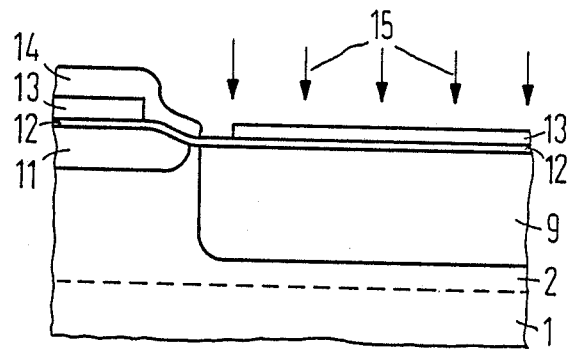

In FIG. 5, by means of a tempering at 1000° C. for about two to three hours, both wells 9 and 11 are driven in. The overall oxide layer 3, 8 is then removed. The masking layers 12, 13 composed of silicon oxide 12 and silicon nitride 13 are applied for the following LOCOS process and structured by photolithography 9 (not shown). After covering the regions outside of the p-well 9 with a photoresist mask 14, the field ion implantation of the regions of the n-channel field oxide transistors is carried out by means of a boron-implantation 15 having a dose and an energy of $1 \times 10^{13}$ cm$^{-2}$ and 25 keV, respectively.

The process of a conventional technology follows this process step, whereby one or more channel ion implantations are to be carried out in accord with corresponding photo-techniques, such implantations being dependent on gate oxide thickness and gate material. The process technology is essentially known. For example, such can follow the process disclosed in European Patent Application No. 0 0135 163.

Figure 6:
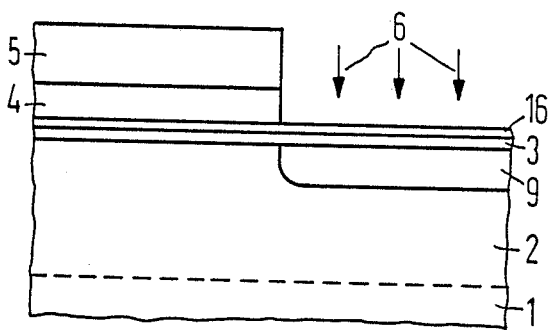

In FIG. 6, one also proceeds from an n+-doped silicon substrate 1 provided with an n−-epitaxial layer 2, as previously shown in FIG. 1. This substrate 1, 2 is now covered with a triple layer having the layer sequence silicon oxide 2 (50 nm thick), polysilicon 16 (100-200 nm thick) and silicon nitride 4 (100-200 nm thick). The uppermost layer 4 composed of silicon nitride is structured with a photoresist mask 5 so that the later n-well regions 11 remain covered by this layer 4 during the boron ion implantation 6 for the production of the p-well 9. The implantation conditions are the same as previously set forth in relation to FIG. 1.

Figure 7:
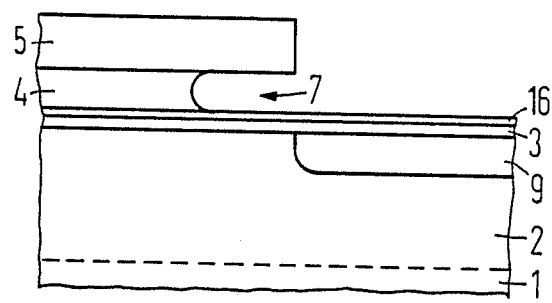

The FIG. 7, upon employment of the photoresist mask 5 as an etching mask, the same under-etching step as in the case of FIG. 2 is now carried out. A lateral etch-in (see arrow 7) into the silicon nitride layer 4 is produced.

Figure 8:
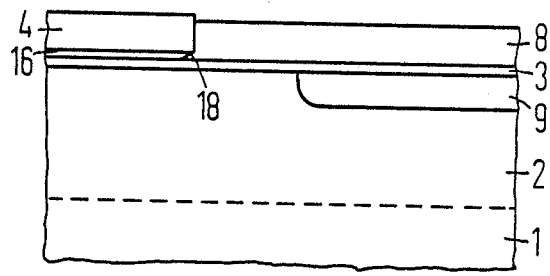

In FIG. 8, the photoresist mask 5 is removed after the procedure of FIG. 3, and the masking oxide 8 for the p-well regions 9 for the following phosphorous ion implantation 10 for producing the n-well is grown. The polysilicon layer 16 is thereby oxidized in its full layer thickness, and the masking oxide 8 arises in a layer thickness of 650 nm having a box-shaped edge course 18 in the region of the under-etching 7.

Figure 9:
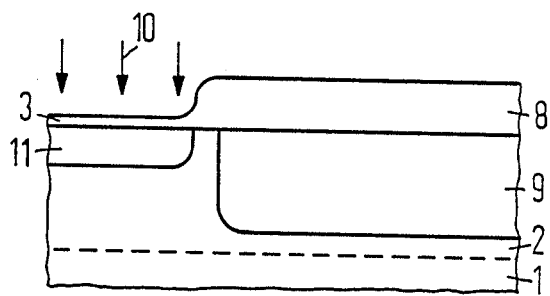

In FIG. 9, the region nitride structure 4 is removed, as is the (non-oxidized) polysilicon layer 16 under the silicon nitride layer structure 4. Next, tempering and drive-in of the p-well 9 ensues at 1150° C. in about 100 to 600 minutes. The production of the n-well 11 by phosphorous ion implantation 10 follows like in FIG. 4.

Figure 10:
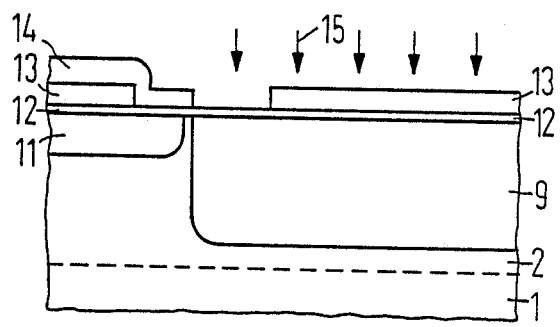

In FIG. 10, the method's steps are analogous to those set forth previously in FIG. 5. The following process steps for finishing the component known from the prior art are likewise analogous. As may be derived from FIG. 10, the under-etching 7 into the nitride mask 4, and the following oxidation of the exposed polysilicon layer 16 to form a box-shaped masking oxide 8, 18, lead to a steeper diffusion front in the n-well drive-in 11.

The process sequences described in FIGS. 1-10 are valid for a p-well process which is built-up on n-silicon starting material; analogously, they can also be transferred to an n-well process based on p-silicon starting material.

Having now fully described the invention, it will be apparent to one of ordinary skill in the art that many changes and modifications can be made thereto without departing from the spirit or scope of the invention as set forth herein.

We claim:

1. In an improved method for the manufacture of neighboring wells implanted with dopant ions differing in conductivity type in the manufacture of VLSI complementary MOS field effect transistors (CMOS) circuits, wherein n+-doped, or, alternatively, p+-doped, silicon having an n−-doped, or, alternatively, p−-doped, epitaxial layer situated thereon is employed as a semiconductor substrate into which first p-wells are introduced upon employment of a composite layer consisting of a silicon oxide layer and a silicon nitride layer which composite layer is covered with a first photoresist as masking layer for n-wells, and then said n-wells are introduced upon employment of a silicon oxide layer covered with a second photoresist as masking layer for said p-wells, and whereby the edge of said composite layer is shifted in the direction of said n-wells by means of directed, lateral under-etching of said composite layer and by means of subsequent oxidation preceding the production of said n-wells, the improvement comprising:

conducting said under-etching of said composite layer by isotropically etching into said silicon nitride mask layer under said first photoresist layer with all layers lying therebelow being not appreciably etched; and generating an auxiliary polysilicon layer immediately above said silicon nitride mask layer and structured together with said first photoresist layer to protect said silicon nitride mask layer during said under-etching.

2. The method of claim 1, wherein a polysilicon layer is interposed between said silicon oxide silicon nitride layer and said layer, and said polysilicon layer is oxidized for masking said p-wells.

3. The method of claim 2, wherein the layer thickness of said polysilicon layer ranges from about 100 to 200 nm.

4. The method of claim 1 wherein said under-etching into said silicon nitride layer is carried out at about 160° C. with hot 85% concentration phosphoric acid.

* * * * *